US010115769B1

(12) United States Patent
Tseng et al.

(10) Patent No.: US 10,115,769 B1
(45) Date of Patent: Oct. 30, 2018

(54) RESISTIVE RANDOM ACCESS MEMORY DEVICE AND METHOD FOR MANUFACTURING THE SAME

(71) Applicant: MACRONIX INTERNATIONAL CO., LTD., Hsinchu (TW)

(72) Inventors: Po-Hao Tseng, Taichung (TW); Feng-Min Lee, Hsinchu (TW); Yu-Yu Lin, New Taipei (TW); Kai-Chieh Hsu, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/620,880

(22) Filed: Jun. 13, 2017

(51) Int. Cl.
*H01L 27/24* (2006.01)
*H01L 45/00* (2006.01)

(52) U.S. Cl.
CPC ...... *H01L 27/2436* (2013.01); *H01L 45/1233* (2013.01); *H01L 45/16* (2013.01)

(58) Field of Classification Search
CPC .. H01L 27/2436; H01L 45/16; H01L 45/1233
See application file for complete search history.

(56) References Cited

U.S. PATENT DOCUMENTS

| 8,659,090 B2 | 2/2014 | Huang et al. |
| 9,312,482 B2 | 4/2016 | Tu et al. |
| 9,349,953 B2 | 5/2016 | Tu et al. |
| 9,431,603 B1 | 8/2016 | Hsieh et al. |

| 2008/0029754 A1* | 2/2008 | Min | H01L 27/2409 257/4 |
| 2008/0121958 A1* | 5/2008 | Izumi | H01L 27/11502 257/295 |
| 2009/0257271 A1* | 10/2009 | Noshiro | H01L 27/101 365/148 |
| 2010/0167462 A1* | 7/2010 | Lee | H01L 45/04 438/104 |
| 2011/0272664 A1* | 11/2011 | Tada | H01L 27/228 257/4 |
| 2013/0134374 A1* | 5/2013 | Kim | H01L 45/00 257/2 |
| 2014/0103346 A1* | 4/2014 | Yamazaki | H01L 29/7869 257/57 |

(Continued)

FOREIGN PATENT DOCUMENTS

TW 201711167 A 3/2017

OTHER PUBLICATIONS

TIPO Office Action dated Feb. 12, 2018 in Taiwan application (No. 106119710).

*Primary Examiner* — Victor A Mandala
(74) *Attorney, Agent, or Firm* — McClure, Qualey & Rodack, LLP

(57) ABSTRACT

A ReRAM device is provided. The ReRAM device comprises a first dielectric layer disposed on a substrate and covering a gate oxide structure on the substrate, a first conductive connecting structure disposed on the substrate and penetrating the first dielectric layer, and a ReRAM unit disposed on the first conductive connecting structure. The first dielectric layer comprises a first insulating layer disposed on the substrate, and a stop layer disposed on the first insulating layer and contacting a top surface of the gate oxide structure, wherein the stop layer is a hydrogen controlled layer.

20 Claims, 6 Drawing Sheets

(56) References Cited

U.S. PATENT DOCUMENTS

| | | | |
|---|---|---|---|
| 2014/0113428 A1* | 4/2014 | Lin | H01L 27/0688 |
| | | | 438/382 |
| 2014/0252295 A1* | 9/2014 | Liao | H01L 45/04 |
| | | | 257/2 |
| 2016/0112035 A1* | 4/2016 | Kurokawa | H03K 3/012 |
| | | | 326/93 |
| 2016/0225986 A1 | 8/2016 | Hsu et al. | |
| 2016/0308119 A1* | 10/2016 | Hsu | H01L 43/08 |
| 2017/0125440 A1* | 5/2017 | Kozuma | H01L 28/00 |
| 2017/0155043 A1* | 6/2017 | Hsieh | H01L 45/08 |

\* cited by examiner

RESISTIVE RANDOM ACCESS MEMORY DEVICE AND METHOD FOR MANUFACTURING THE SAME

BACKGROUND

Field of the Invention

The disclosure relates in general to a resistive random access memory device and a method for manufacturing the resistive random access memory device.

Description of the Related Art

Resistive random-access memory (ReRAM) is a type of a memory having a component called a memristor (contraction of "memory resistor"), whose resistance varies when different voltages are imposed across it. The ReRAM device works by changing the resistance of the memristor to store data.

During manufactiring the ReRAM device, a soldering reflow process may be performed, while it may cause data retention loss of the ReRAM device for a high temperature in the process. Therefore, it is desirable to develop a method to prevent a ReRAM device from data retention loss and produce a ReRAM device with excellent structural reliability.

SUMMARY

The disclosure relates to a resistive random access memory (ReRAM) device and a method for manufacturing the same, which provide the ReRAM device with a stop layer having a lower hydrogen content, so that the ReRAM device can have lower data retention loss after a high temperature process (such as a soldering reflow process), and the reliability of the ReRAM can be improved.

According to one embodiment, a ReRAM device is provided. The ReRAM device comprises a first dielectric layer disposed on a substrate and covering a gate oxide structure on the substrate, a first conductive connecting structure disposed on the substrate and penetrating the first dielectric layer, and a ReRAM unit disposed on the first conductive connecting structure. The first dielectric layer comprises a first insulating layer disposed on the substrate, and a stop layer disposed on the first insulating layer and contacting a top surface of the gate oxide structure, wherein the stop layer is a hydrogen controlled layer.

According to one embodiment, a method for manufacturing the ReRAM device is provided. The method comprises the following steps. Firstly, a first dielectric layer is formed on a substrate and covering a gate oxide structure on the substrate. The formation of the first dielectric layer comprises forming a first insulating layer on the substrate, and forming a stop layer on the first insulating layer and contacting a top surface of the gate oxide structure, wherein the stop layer is a hydrogen controlled layer. Next, a first conductive connecting structure is formed on the substrate and penetrating the first dielectric layer. Then, a ReRAM unit is formed on the first conductive connecting structure.

The disclosure will become apparent from the following detailed description of the preferred but non-limiting embodiments. The following description is made with reference to the accompanying drawings.

DETAILED DESCRIPTION

Figure 1:
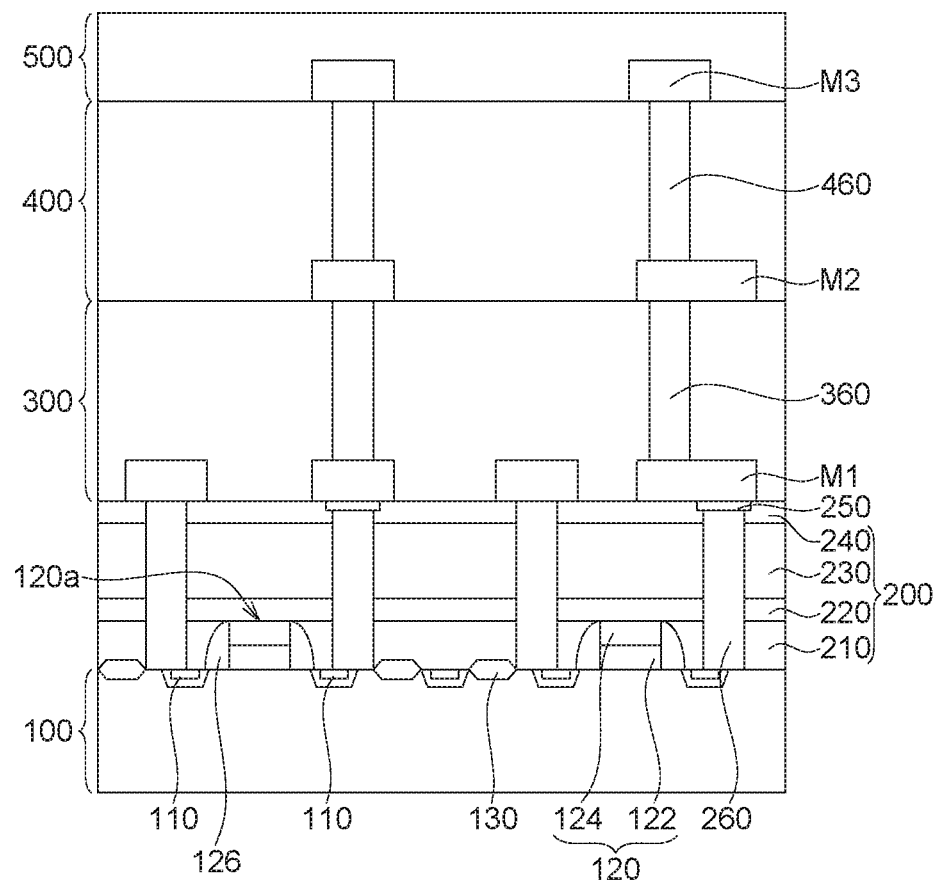
FIG. 1 is a cross-sectional view illustrating a ReRAM device according to an embodiment of the present application.

The embodiments of the present disclosure disclosed below are for elaborating a resistive random access memory (ReRAM) device and a method for manufacturing the same. The ReRAM device and the method for manufacturing the same provide the ReRAM device with a stop layer having a lower hydrogen content, so that the ReRAM device can have lower data retention loss after a high temperature process (such as a soldering reflow), and the reliability of the ReRAM can be improved.

Several embodiments are provided hereinafter with reference to the accompanying drawings for describing the related procedures and configurations. Related structural details, such as layers and spatial arrangement, are further described in the embodiments. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1 is a cross-sectional view illustrating a ReRAM device according to an embodiment of the present application.

Referring to FIG. 1, a resistive random access memory (ReRAM) device 10 comprises a first dielectric layer 200 (such as an inter-layer dielectric (ILD)) disposed on a substrate 100 and covering a gate oxide structure 120 on the substrate 100, a first conductive connecting structure 260 disposed on the substrate 100 and penetrating the first dielectric layer 200, and a ReRAM unit 250 disposed on the first conductive connecting structure 260.

In some embodiments, the substrate 100 may be formed of Si-containing oxide or other suitable material for the substrate. A well 110 may be formed in the substrate 100. The well 110 may be a P-type doped well or N-type doped well, and may be used as a source or a drain. The gate oxide structure 120 may be formed on the substrate 100 and include an oxide layer 122 and a gate material layer 124. The gate material layer 124 may be formed of polysilicon.

Spacers 126 may be formed on the sidewalls of the gate oxide structure 120. A field oxide layer 130 may be formed on the substrate 100.

In one embodiment, the first dielectric layer 200 comprises a first insulating layer 210 disposed on the substrate 100; and a stop layer 220 disposed on the first insulating layer 210 and contacting a top surface of the gate oxide structure 120, wherein the stop layer 220 is a hydrogen controlled layer. That is, the stop layer 220 is a hydrogen less layer having a ratio of hydrogen smaller than 7%, a thinned down layer having a thickness smaller than 400 angstroms, or a hydrogen decreased layer having a ratio of hydrogen smaller than 7% and a thickness smaller than 400 angstroms. The content of hydrogen of the stop layer 220 can be controlled by decreasing the amount of hydrogen applied to the stop layer 220 or by decreasing the thickness of the stop layer 220.

In the present disclosure, the ratio of the hydrogen are all presented as composition percentage. The ratio of the hydrogen can be measured by a thin layer analysis, wherein the thin layer analysis can be Rutherford Backscattering Spectrometer (RBS), low energy electron induced X-ray emission Spectrometry (LEXES), X-ray photoelectron spectroscopy (XPS), Auger Electron Spectroscopy (AES), Secondary-Ion Mass Spectrometer (SIMS), Fourier transform infrared spectrometer (FTIR), Raman Spectroscopy . . . etc.

In some embodiment, the first insulating layer 210 may be formed of undoped silicate glass (USG). The first insulating layer 210 may have a thickness of 100 angstroms.

In some embodiment, the stop layer 220 may be formed as the hydrogenless layer having a ratio of hydrogen smaller than 7% (such as 0%, 2%, 4% or 6%). The stop layer 220 (such as a hydrogen less layer) may have no hydrogen. The stop layer 220 (such as a hydrogen controlled layer) may have a thickness in a range of 400 to 1000 angstroms. In one embodiment, the stop layer 220 may have a thickness of 450 angstroms.

In some embodiment, the stop layer 220 may be formed as the thinned down layer having a thickness in a range of 25-400 angstroms, and a ratio of hydrogen in a range of 7 to 30%. After decreasing the thickness of the stop layer, the hydrogen content of the stop layer 220 can also be reduced.

In some embodiment, the stop layer 220 may be formed as the hydrogen decreased layer having a ratio of hydrogen smaller than 7% (such as 0%, 2%, 4% or 6%). The stop layer 220 (such as a hydrogen decreased layer) may also be hydrogen free. The stop layer 220 (such as a hydrogen decreased layer) may have a thickness in a range of 100-350 angstroms.

In some embodiments, when the stop layer 220 is formed as the hydrogen less layer or the hydrogen decreased layer, the stop layer 220 may comprise a material selected from a group consisted of poly-silicon, amorphous silicon, silicon oxynitride (SiON), robust silicon oxide ($SiO_2$), silicon nitride (SiN) and a high-k material, wherein the high-k material may be hafnium oxide ($HfO_2$), Aluminum oxide ($Al_2O_3$) or Tantalum oxide ($Ta_2O_5$). The robust silicon oxide may be an oxide having a higher hardness, such as a thermal oxide or tetraethoxysilane (TEOS).

In some embodiments, when the stop layer 220 is formed as the thinned down layer, the stop layer 220 may comprise silicon nitride (SiN).

Since the stop layer 220 of the present disclosure may be formed as a hydrogen controlled layer, i.e. a hydrogen less layer, a thinned down layer or a hydrogen decreased layer, the content of hydrogen of the stop layer 220 is less than that of a stop layer having a ratio of hydrogen equal to or larger than 7% and a thickness larger than 400 angstroms in a comparison example. A stop layer can be used to prevent a recess issue on a surface of source/drain during contact etching (such as an etching for forming the conductive connecting structure). However, if a stop layer has a higher hydrogen content, such as having a ratio of hydrogen equal to or larger than 7% and a thickness larger than 400 angstroms, the data retention capability of the ReRAM device may be adversely affected after a high temperature process, such as a soldering reflow process. The ReRAM device of the present application has a modified stop layer 220, which having a lower hydrogen content in the stop layer 220, by forming the stop layer 220 as a hydrogen controlled layer, such as a hydrogen less layer having a ratio of hydrogen smaller than 7%, a thinned down layer having a thickness smaller than 400 angstroms, or a hydrogen decreased layer having a ratio of hydrogen smaller than 7% and a thickness smaller than 400 angstroms. In this way, the lower hydrogen content in the stop layer 220 can obviously reduce the data retention loss of the ReRAM device after a high temperature process, and the reliability of the ReRAM can be improved.

In some embodiments, the first conductive connecting structure 260 may comprise a material selected from tungsten and TiN.

Figure 12:
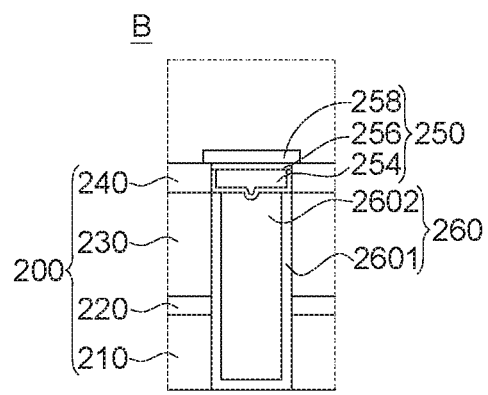

In some embodiments, the ReRAM unit 250 may comprise a bottom electrode 254 disposed on the first conductive connecting structure 260, a resistance switching layer 256 disposed on the bottom electrode 254, and a top electrode 258 disposed on the resistance switching layer 256, as shown in FIG. 12.

In some embodiments, the bottom electrode 254 may comprise a material selected from TiN, W, Ta, and Hf. The resistance switching layer 256 may comprise a material selected from TiN, $WO_x$, $Ta_2O_5$, $HfO_2$, $SiO_2$. The material of the resistance switching layer 256 is not limited thereto, and can be any other material suitable to be a resistance switching layer in the ReRAM device. The bottom electrode 254 and the first conductive connecting structure 260 may comprise a same material.

In some embodiment, the bottom electrode 254 may be formed above a top surface of the first dielectric layer 200 and contact the first conductive connecting structure 260.

In some embodiment, the bottom electrode 254 may be formed below a top surface of the first dielectric layer 200 and contact the first conductive connecting structure 260.

In some embodiment, the bottom electrode 254 and the top electrode 258 may be a single layer structure or a multiple layer structure. For example, the bottom electrode 254 may be a double layer structure formed of TiN and tungsten, or the bottom electrode 254 may be a single layer structure formed of Hf. The top electrode 258 may be a double layer structure formed of TiN and Ti.

In some embodiments, the first dielectric layer 200 may comprise a second insulating layer 230 disposed on the stop layer 220 and a third insulating layer 240 disposed on the second insulating layer 230. The second insulating layer 230 may be formed of phosphosilicate glass (PSG) and may have a thickness of 5,500 angstroms. The third insulating layer 240 may be formed of TEOS and may have a thickness of 2,000 angstroms.

In some embodiments, the ReRAM device 10 may comprise a first metal layer M1 disposed over the first dielectric layer 200; a second dielectric layer 300 (such as an inter-metal dielectric (IMD)) disposed on the first dielectric layer 200 and covering the first metal layer M1; a second conductive connecting structure 360 disposed on the first metal layer M1 and penetrating the second dielectric layer 300; a second metal layer M2 disposed on the second conductive connecting structure 360; a third dielectric layer 400 (such as an inter-metal dielectric (IMD)) disposed on the second dielectric layer 300 and covering the second metal layer M2; a third conductive connecting structure 460 disposed on the second metal layer M2 and penetrating the third dielectric layer 400; a third metal layer M3 disposed on the third conductive connecting structure 460; and an isolation layer 500 disposed on the third dielectric layer 400 and covering the third metal layer M3.

In some embodiment, the material of the first metal layer M1, the second metal layer M2 and the third metal layer M3 may be any metal material, such as aluminum (Al), copper (Cu). The second conductive connecting structure 360 and the third conductive connecting structure 460 may comprise a material selected from tungsten and TiN. The second dielectric layer 300 and the third dielectric layer 400 may comprise a material selected from USG, PSG and TEOS. The isolation layer 500 may be formed of nitride, and can be a passivation layer.

In the present embodiment, ReRAM device includes three dielectric layers and three metal layers, but the number of the dielectric layers and the metal layers are not limited thereto. In some embodiments, the number of the dielectric layers can be larger than or smaller than three, and the number of the metal layers can also be larger than or smaller than three.

FIG. 2 to FIG. 13 are cross-sectional views illustrating a method for manufacturing a ReRAM device according to an embodiment of the present disclosure.

Figure 2:
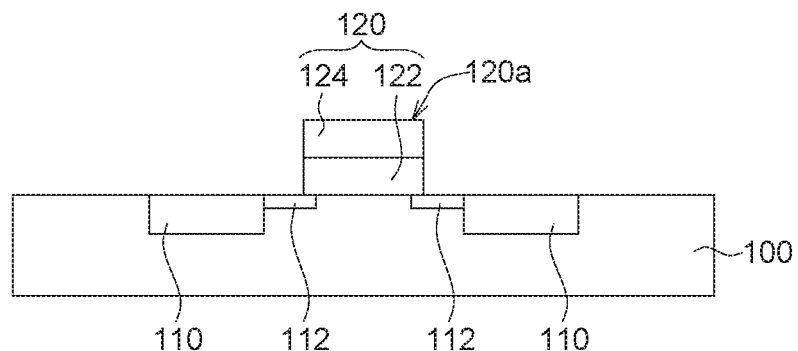
FIG. 2 to FIG. 12 are cross-sectional views illustrating a method for manufacturing a ReRAM device according to an embodiment of the present disclosure.

Referring to FIG. 2, a preliminary structure 101 is provided. The preliminary structure 101 may be formed by a front end process in a conventional CMOS process. The preliminary structure 101 may comprise a substrate 100, a well 110 formed in the substrate 100, a lightly doped drain implant (LDD) 112 formed in the substrate 100, and a gate oxide structure 120 formed on the substrate 100. The gate oxide structure 120 may comprise an oxide layer 122 and a gate material layer 124. The gate material layer 124 may be formed of polysilicon. Spacers (not shown) may be formed on the sidewalls of the gate oxide structure 120. A field oxide layer (not shown) may be formed on the substrate 100.

Figure 3:
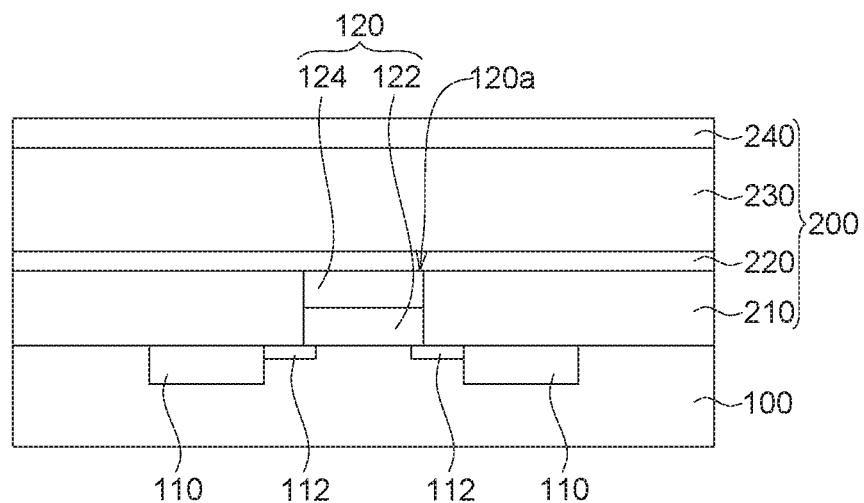

Referring to FIG. 3, a first dielectric layer 200 (such as an inter-layer dielectric (ILD)) is formed on the substrate 100 by a deposition process, such as Plasma-Enhanced Chemical Vapor Deposition (PECVD) or Chemical Vapor Deposition (CVD). The forming of the first dielectric layer 200 may comprise sequentially forming a first insulating layer 210, a stop layer 220, a second insulating layer 230, a third insulating layer 240 over the substrate 100 by a deposition process. The stop layer 220 may be disposed on the first insulating layer 210 and contacting a top surface of the gate oxide structure 120, wherein the stop layer 220 is a hydrogen controlled layer. That is, the stop layer 220 is a hydrogen less layer having a ratio of hydrogen smaller than 7%, a thinned down layer having a thickness smaller than 400 angstroms, or a hydrogen decreased layer having a ratio of hydrogen smaller than 7% and a thickness smaller than 400 angstroms.

In some embodiment, the first insulating layer 210 may be formed of undoped silicate glass (USG). The first insulating layer 210 may have a thickness of 100 angstroms.

In some embodiment, the stop layer 220 may be formed as the hydrogen controlled layer having a ratio of hydrogen smaller than 7% (such as 0%, 2%, 4% or 6%). The hydrogen controlled layer may also be hydrogen free. That is, the stop layer 220 may have no hydrogen. The hydrogen controlled layer may have a thickness in a range of 400 to 1000 angstroms. In one embodiment, the stop layer 220 may have a thickness of 450 angstroms.

In some embodiment, the stop layer 220 may be formed as the thinned down layer having a thickness in a range of 25-400 angstroms, and a ratio of hydrogen in a range of 7 to 30%.

In some embodiment, the stop layer 220 may be formed as the hydrogen decreased layer having a ratio of hydrogen smaller than 7% (such as 0%, 2%, 4% or 6%). The hydrogen decreased layer may also be hydrogen free. That is, the stop layer 220 may have no hydrogen. The hydrogen decreased layer may have a thickness in a range of 25-400 angstroms.

In some embodiments, when the stop layer 220 is formed as the hydrogen less layer or the hydrogen decreased layer, the stop layer 220 may comprise a material selected from a group consisted of poly-silicon, amorphous silicon, silicon oxynitride (SiON), robust silicon oxide ($SiO_2$), silicon nitride (SiN) and a high-k material, wherein the high-k material may be hafnium oxide ($HfO_2$), Aluminum oxide ($Al_2O_3$) or Tantalum oxide ($Ta_2O_5$). The robust silicon oxide may be an oxide having a higher hardness, such as a thermal oxide or tetraethoxysilane (TEOS).

In some embodiments, when the stop layer 220 is formed as the thinned down layer, the stop layer 220 may comprise silicon nitride (SiN).

In some embodiments, the first conductive connecting structure 260 may comprise a material selected from tungsten, Ti and TiN.

In some embodiments, the second insulating layer 230 may be formed of phosphosilicate glass (PSG) and may have a thickness of 5,500 angstroms. The third insulating layer 240 may be formed of TEOS and may have a thickness of 2,000 angstroms.

Figure 4:
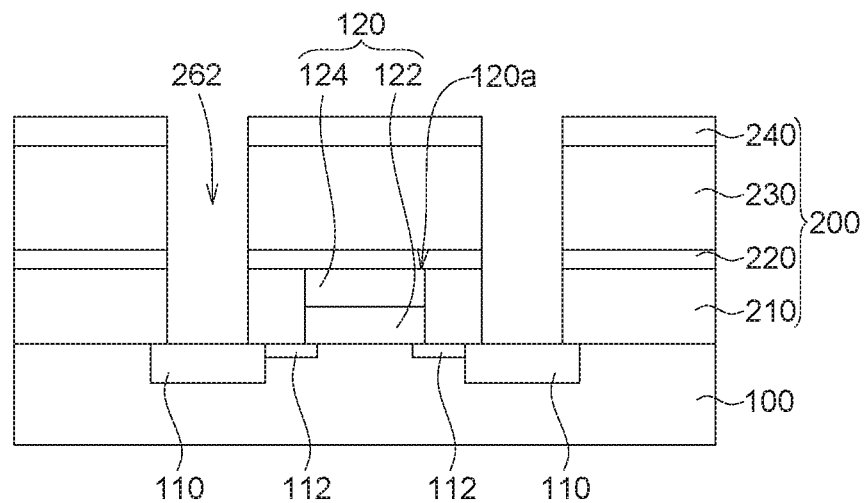

Referring to FIG. 4, a first opening 262 is formed above the well 110 penetrating the first insulating layer 210 by etching processes. The first opening 262 may not be formed in one time by a single etching process. That is, a first etching process may be performed and stop on the stop layer 220, and a second etching process may be then performed to expose the well 110. Owing to the stop layer 220, a recess issue on a surface of the well 110 (source/drain) can be prevented during etching (such as an etching for forming the conductive connecting structure).

Figure 5:
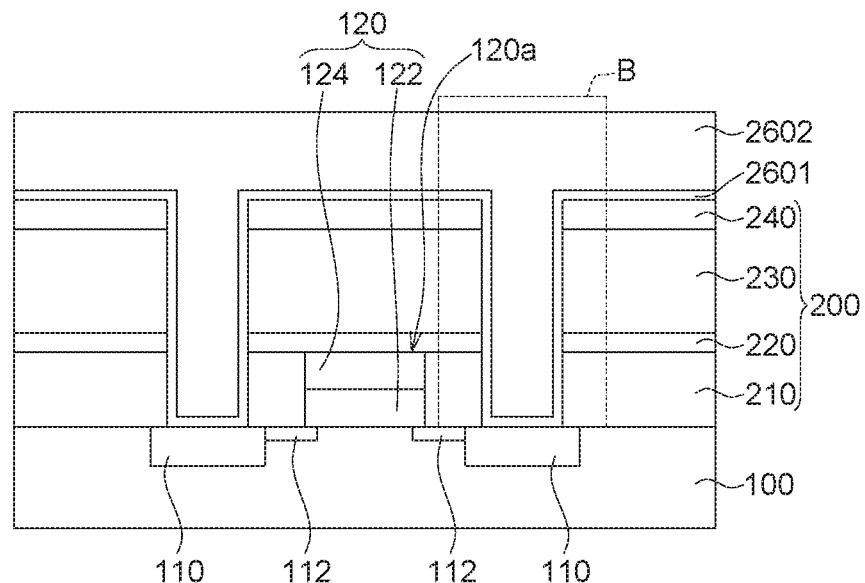

Referring to FIG. 5, a first conductive connecting layer 2601 and a second conductive connecting layer 2602 are formed on the first dielectric layer 200 and in the first opening 262. In one embodiment, the material of the first conductive connecting layer 2601 may be Ti or TiN. The material of the second conductive connecting layer 2602 may be tungsten.

Figure 6:
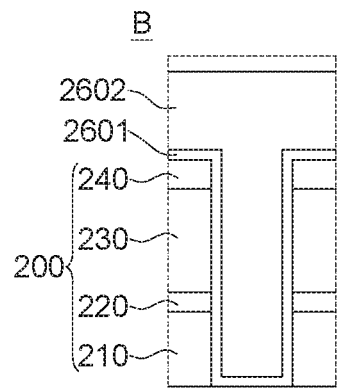

Referring to FIG. 5 and FIG. 6, FIG. 6 illustrates an enlarged drawing of a block B in FIG. 5. FIG. 7 to FIG. 12 illustrate the following steps according to FIG. 6.

Figure 7:
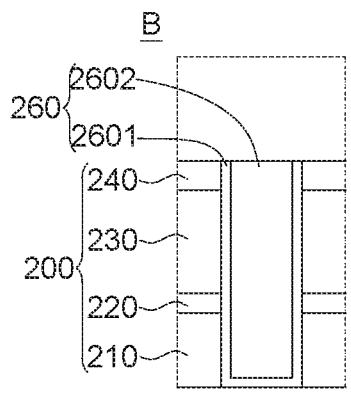

Referring to FIG. 7, a portion of the first conductive connecting layer 2601 and the second conductive connecting layer 2602 are removed by a Chemical Mechanical Polishing (CMP) step. That is, the portion of the first conductive connecting layer 2601 and the second conductive connecting layer 2602 above the first opening 262 are completely removed. Then, the first conductive connecting structure 260 is formed penetrating the first dielectric layer 200.

Figure 8:
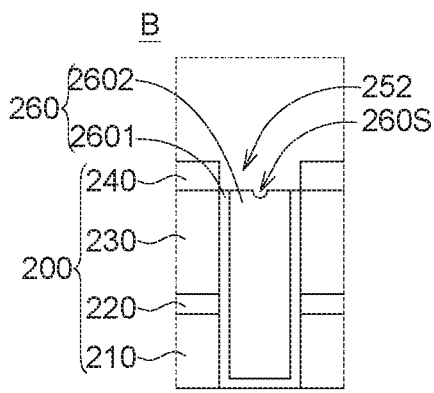

Referring to FIG. 8, a portion of the first conductive connecting layer 2601 and the second conductive connecting layer 2602 are removed by an etching process (such as an etching back process), and a second opening 252 and a seam 260S are formed.

Figure 9:
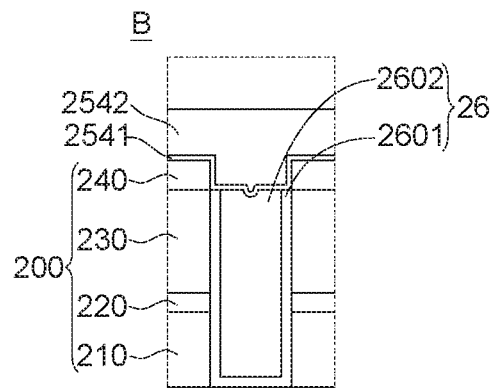

Referring to FIG. 9, a first bottom electrode layer 2541 and a second bottom electrode layer 2542 are formed on the first dielectric layer 200 and in the second opening 252 and the seam 260S by, for example, a deposition process. In one embodiment, the material of the first bottom electrode layer 2541 may be Ti or TiN. The material of the second bottom electrode layer 2542 may be tungsten.

Figure 10:
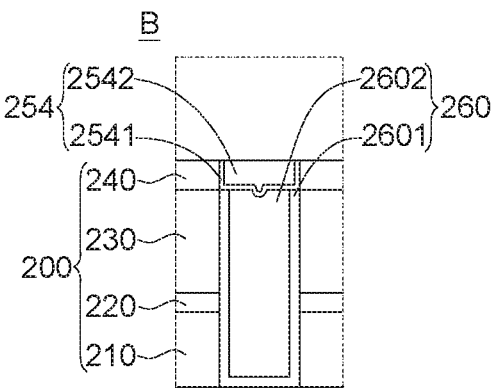

Referring to FIG. 10, a portion of the first bottom electrode layer 2541 and the second bottom electrode layer 2542 are removed by a Chemical Mechanical Polishing (CMP) step. That is, the portion of the first bottom electrode layer 2541 and the second bottom electrode layer 2542 above the second opening 252 are completely removed. Then, the bottom electrode 254 is formed on the first conductive connecting structure 260.

Figure 11:
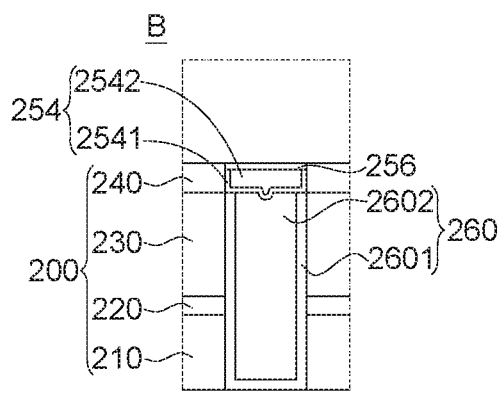

Referring to FIG. 11, a resistance switching layer 256 then is formed by an oxidation process to the bottom electrode 254. In some embodiments, the oxidation process is implemented by a plasma oxidation process.

Referring to FIG. 12, a top electrode 258 is formed on the resistance switching layer 256. The top electrode 258 can cover the resistance switching layer 256 and a portion of the first dielectric layer 200. In some embodiment, the top electrode 258 can be formed of the metal. In some embodiment, the top electrode 258 can be selected from TiN, Ti, Al, Ir, Pt, and Ni. In this way, the ReRAM unit 250 including the bottom electrode 254, the resistance switching layer 256 and the top electrode 258 is formed on the first conductive connecting structure 260.

After forming the ReRAM unit 250, a first metal layer M1 may be formed over the first dielectric layer 200, the first conductive connecting structure 260 and the ReRAM unit 250. A second dielectric layer 300 (such as an inter-metal dielectric (IMD)) may be formed on the first dielectric layer 200 and cover the first metal layer M1. A second conductive connecting structure 360 may be formed on the first metal layer M1 and penetrate the second dielectric layer 300. A second metal layer M2 may be formed on the second conductive connecting structure 360. A third dielectric layer 400 (such as an inter-metal dielectric (IMD)) may be formed on the second dielectric layer 300 and cover the second metal layer M2. A third conductive connecting structure 460 may be formed on the second metal layer M2 and penetrate the third dielectric layer 400. A third metal layer M3 may be formed on the third conductive connecting structure 460. An isolation layer 500 may be formed on the third dielectric layer 400 and cover the third metal layer M3. In this way, the ReRAM device 10 according to one embodiment of the present application is formed, as illustrated in FIG. 1.

In some embodiment, the material of the first metal layer M1, the second metal layer M2 and the third metal layer M3 may be any metal material, such as aluminum (Al), copper (Cu). The second conductive connecting structure 360 and the third conductive connecting structure 460 may comprise a material selected from tungsten and TiN. The second dielectric layer 300 and the third dielectric layer 400 may comprise a material selected from USG, PSG and TEOS. The isolation layer 500 may be formed of nitride and can be a passivation layer.

Figure 13A:
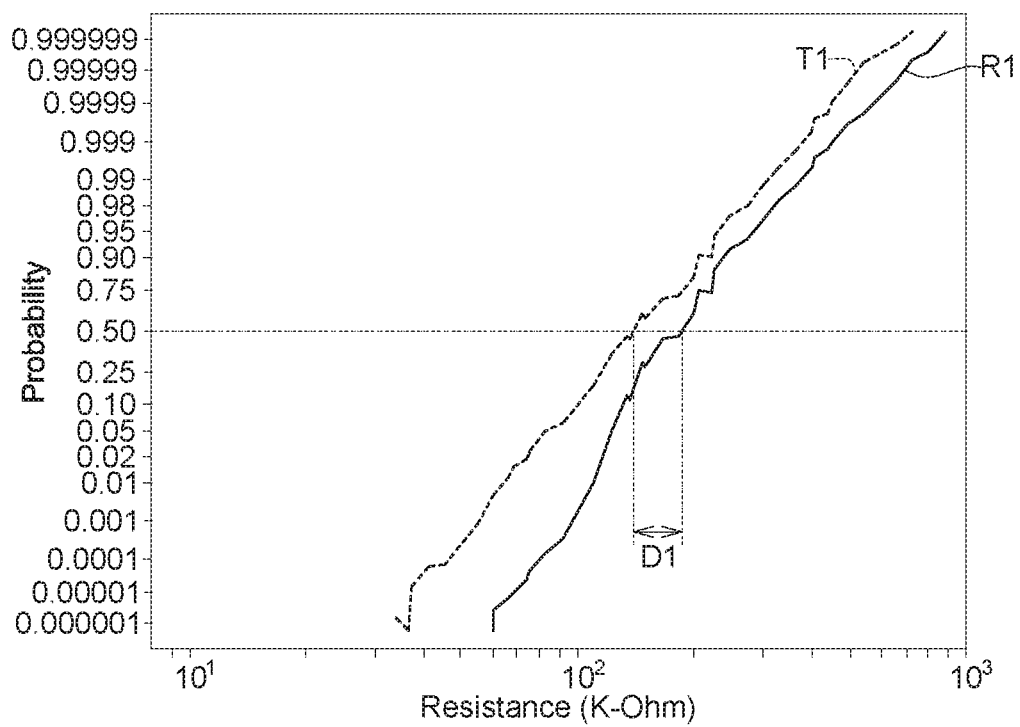
FIG. 13A shows data retention capability of a ReRAM device according to a comparison example of the present disclosure.
Figure 13B:
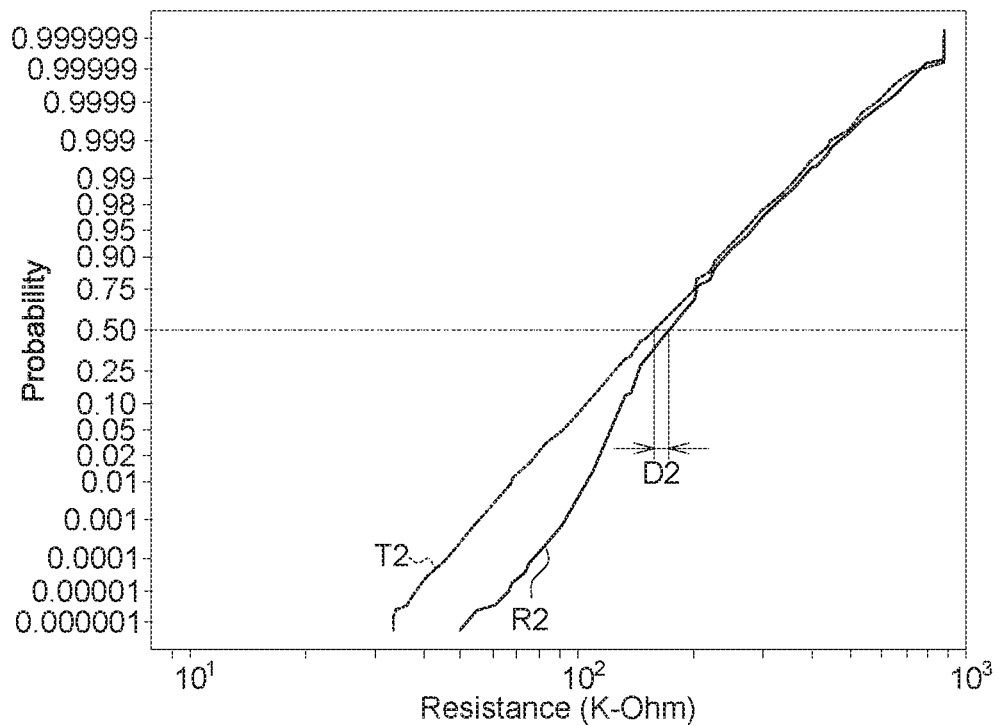
FIG. 13B shows data retention capability of a ReRAM device according to an embodiment of the present disclosure.

FIG. 13A shows data retention capability of a ReRAM device according to a comparison example of the present disclosure. FIG. 13B shows data retention capability of a ReRAM device according to an embodiment of the present disclosure.

In FIG. 13A, the ReRAM device of the comparison example has a stop layer having a ratio of hydrogen larger than 7% and a thickness larger than 400 angstroms. Line R1 represents a resistance distribution of the ReRAM device in a reset state, that is, having a high resistance. Line T1 represents a resistance distribution of the ReRAM device of the comparison example being heated to 200° C. for 1 hour.

In FIG. 13B, the ReRAM device according to one embodiment of the present application has a stop layer having a content of hydrogen lower than that of the stop layer in the comparison example (such as a ratio of hydrogen smaller than 7%). Line R2 represents a resistance distribution of the ReRAM device in a reset state, that is, having a high resistance. Line T2 represents a resistance distribution of the ReRAM device according to one embodiment of the present application being heated to 200° C. for 1 hour.

Referring to FIG. 13A and FIG. 13B, the data retention capability of the ReRAM device according to one embodiment of the present application is better than the data retention capability of the ReRAM of the comparison example. For example, in terms of 50% probability in 1 million bits, line T1 shifts a distance D1 from Line R1, line T2 shifts a distance D2 from Line R2, and the distance D1 is larger than the distance D2. That is, after replacing the stop layer to a modified stop layer having a lower hydrogen content (such as a ratio of hydrogen smaller than 7%), even if performing a high temperature process (such as being heated to 200° C. for 1 hour), the shift of the resistance from the high resistance of the ReRAM device in a reset state is obviously reduced, the data loss after a high temperature process is decreased, and the data retention is largely improved.

According to the aforementioned description, the ReRAM device according to one embodiment of the present disclosure include a stop layer having a reduced hydrogen content comparing to the stop layer having a ratio of hydrogen larger than 7% and a thickness larger than 400 angstroms in the comparison example. Accordingly, the ReRAM device of the present disclosure can prevent from a recess issue on the surface of the source/drain during forming the conductive connecting structure by an etching process. Also, the data retention loss after a high temperature process can be obviously reduced, the data retention capability of the ReRAM device is enhanced, and the reliability of the ReRAM can be improved.

Other embodiments with different configurations of known elements in the device can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A resistive random access memory (ReRAM) device, comprising:

a first dielectric layer disposed on a substrate and covering a gate oxide structure on the substrate, and the first dielectric layer comprising:
- a first insulating layer disposed on the substrate; and
- a stop layer disposed on the first insulating layer and directly contacting a top surface of the gate oxide structure, wherein the stop layer is a hydrogen controlled layer;

a first conductive connecting structure disposed on the substrate and penetrating the first dielectric layer; and a ReRAM unit disposed on the first conductive connecting structure.

2. The ReRAM device according to claim 1, wherein the hydrogen controlled layer is hydrogen free.

3. The ReRAM device according to claim 1, wherein the stop layer is a hydrogen less layer having a ratio of hydrogen smaller than 7%.

4. The ReRAM device according to claim 3, wherein the hydrogen controlled layer has a thickness in a range of 400 to 1000 angstroms.

5. The ReRAM device according to claim 1, wherein the stop layer is a thinned down layer having a thickness smaller than 400 angstroms.

6. The ReRAM device according to claim 5, wherein the thinned down layer has a ratio of hydrogen in a range of 7 to 30%.

7. The ReRAM device according to claim 1, wherein the stop layer is a hydrogen decreased layer having a ratio of hydrogen smaller than 7% and a thickness smaller than 400 angstroms.

8. The ReRAM device according to claim 1, wherein the stop layer comprises a material selected from a group consisted of poly-silicon, amorphous silicon, silicon oxynitride, robust silicon oxide, silicon nitride and a high-k material.

9. The ReRAM device according to claim 8, wherein the high-k material is hafnium oxide, Aluminum oxide or Tantalum oxide.

10. The ReRAM device according to claim 1, wherein the ReRAM unit further comprises:
- a bottom electrode disposed on the first conductive connecting structure;
- a resistance switching layer disposed on the bottom electrode; and
- a top electrode disposed on the resistance switching layer.

11. A method for manufacturing a resistive random access memory (ReRAM) device, comprising:

forming a first dielectric layer on a substrate, the first dielectric layer covering a gate oxide structure on the substrate, wherein forming the first dielectric layer comprises:
- forming a first insulating layer on the substrate; and
- forming a stop layer on the first insulating layer, the stop layer directly contacting a top surface of the gate oxide structure, wherein the stop layer is a hydrogen controlled layer;

forming a first conductive connecting structure on the substrate and penetrating the first dielectric layer; and forming a ReRAM unit on the first conductive connecting structure.

12. The method according to claim 11, wherein the stop layer is hydrogen free.

13. The method according to claim 11, wherein the stop layer is a hydrogen less layer having a ratio of hydrogen smaller than 7%.

14. The method according to claim 13, wherein the hydrogen controlled layer has a thickness in a range of 400 to 1000 angstroms.

15. The method according to claim 11, wherein the stop layer is a thinned down layer having a thickness smaller than 400 angstroms.

16. The method according to claim 15, wherein the thinned down layer has a ratio of hydrogen in a range of 7 to 30%.

17. The method according to claim 11, wherein the stop layer is a hydrogen decreased layer having a ratio of hydrogen smaller than 7% and a thickness smaller than 400 angstroms.

18. The method according to claim 11, wherein the stop layer comprises a material selected from a group consisted of poly-silicon, amorphous silicon, silicon oxynitride, robust silicon oxide, silicon nitride and a high-k material.

19. The method according to claim 18, wherein the high-k material is hafnium oxide, Aluminum oxide or Tantalum oxide.

20. The method according to claim 11, wherein forming the ReRAM unit further comprises:
- forming a bottom electrode on the first conductive connecting structure;
- forming a resistance switching layer on the bottom electrode; and
- forming a top electrode on the resistance switching layer.

* * * * *